(12) United States Patent
Koelling et al.

(10) Patent No.: US 6,657,905 B1
(45) Date of Patent: Dec. 2, 2003

(54) CLAMPING CIRCUIT FOR THE VPOP VOLTAGE USED TO PROGRAM ANTIFUSES

(75) Inventors: Jeffrey Koelling, Fairview, TX (US); Timothy B. Cowles, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/147,037

(22) Filed: May 17, 2002

(51) Int. Cl.⁷ .................................................. G11C 7/00
(52) U.S. Cl. .................................. 365/189.09; 365/149
(58) Field of Search ............................ 365/189.09, 149, 365/225.7; 327/535, 536

(56) References Cited

U.S. PATENT DOCUMENTS

| | | |
|---|---|---|
| 5,706,238 A | 1/1998 | Cutter et al. |
| 5,734,617 A | 3/1998 | Zheng |
| 5,742,555 A | 4/1998 | Marr et al. |
| 5,896,041 A | 4/1999 | Sher et al. |
| 5,973,978 A | 10/1999 | Cutter et al. |
| 6,130,834 A | 10/2000 | Mullarkey et al. |
| 6,154,412 A | * 11/2000 | Ishikawa et al. ............ 365/226 |
| 6,255,894 B1 | 7/2001 | Cutter et al. |

* cited by examiner

Primary Examiner—Vu A. Le
(74) Attorney, Agent, or Firm—Dickstein Shapiro Morin & Oshinsky, LLP

(57) ABSTRACT

A booting circuit, used during antifuse programming, that has a clamping circuit designed to prevent a programming voltage from being unnecessarily limited by other components in an integrated circuit. The booting circuit is connected between an external interface, such as a bond pad, and an internal line, and is activated when the programming voltage is being applied directly to the internal line (i.e., not through the external interface). When activated, the clamping circuit allows a suitable and sufficiently high voltage to be applied to the internal line to properly program the antifuses while also clamping the amount of voltage seen at the external interface.

51 Claims, 4 Drawing Sheets

US 6,657,905 B1

CLAMPING CIRCUIT FOR THE VPOP VOLTAGE USED TO PROGRAM ANTIFUSES

FIELD OF THE INVENTION

The present invention relates to a clamping circuit for the Vpop voltage used to program antifuses in an electronic circuit.

BACKGROUND OF THE INVENTION

There are many electronic circuits or integrated circuits (ICs) that utilize antifuses to set or program a piece of logic to a specific value. Antifuses are capacitive-type structures which, in their unblown state, form open circuits. Antifuses are programmed/blown by applying a high voltage across the antifuse. The high voltage causes the capacitive-type structure to break down, forming a conductive path through the antifuse. Therefore, programmed/blown antifuses conduct while unprogrammed/unblown antifuses do not. One circuit, for example, that uses antifuses is a memory circuit.

Typical memory circuits include arrays of memory cells arranged in rows and columns. These memory circuits will also include several redundant rows and columns that are used as substitutes for defective locations in the memory array. When a defective memory array location is identified, rather than treating the entire array as defective, a redundant row or column is substituted for the defective row or column. This substitution is performed by assigning the address of the defective row or column to the redundant row or column such that, when an address signal corresponding to the defective row or column is received, the redundant row or column is addressed instead.

To make the substitution of the redundant row or column substantially transparent to a system including the memory circuit, the memory circuit utilizes an address detection circuit. The address detection circuit monitors row and column addresses and enables redundant rows or columns if the address of a defective row or column is detected. FIG. 1 illustrates the typical memory circuit 10 including an address detection circuit 20, control and address circuitry 12, an array of memory cells 14 and row and columns of redundant memory cells 16.

One type of address detection circuit 20 is a fuse-bank address detection circuit. A fuse-bank address detection circuit utilizes several fuse-bank circuits to control the redundant rows and columns. Each fuse-bank circuit corresponds to one of the redundant rows or columns. If there are eight redundant rows and eight redundant columns, for example, then the address detection circuit 20 will include sixteen fuse-bank circuits. Each fuse-bank circuit includes a bank of sense lines, each sense line connected to a respective fuse. Each sense line corresponds to one bit of a memory address since each fuse-bank will be programmed with an address of a defective memory array location. If an address comprises eight bits, then each fuse-bank circuit includes eight sense fines, each with corresponding fuses.

The sense lines are "programmed" by blowing fuses in a pattern corresponding to the address word of the defective row or column (hereinafter referred to as the programmed addresses). The programmed addresses are then detected by initially applying a test voltage across the bank of sense lines. Then, bits of an external address are applied to the sense lines. If the pattern of blown fuses corresponds exactly to the pattern of external bits, a redundant match will be detected and the output signal will switch to a high state. Otherwise, if at least one external address bit does not correspond to its respective blown fuse, a non-match will be detected and the output signal will be in a low state. Therefore, a high voltage indicates that the programmed address matches the external address while a low voltage does not. A matched address indicates that the redundant row or column should be used.

To save the costs and labor required to blow the conventional fuse, antifuses have replaced fuses in the address detection circuit 20. FIG. 2 illustrates an antifuse circuit 30 used in an antifuse-bank circuit. The circuit 30 corresponds to one bit of a programmed address. As previously stated, if an address consisted of eight bits, then each antifuse-bank circuit would include eight antifuse circuits 30. An antifuse 32, illustrated in its unprogrammed (i.e., unblown) state, is connected to a switchable signal line often referred to as a common ground line (hereinafter "CGND line) and a latch circuit 34. During normal operation, the CGND line is held at a ground potential to provide a reference for the antifuse 32. To program the antifuse 32, the CGND line is supplied with a high voltage sufficient enough to cause the capacitive-type structure of the antifuse 32 to break down. Generally, the high voltage used to program the antifuse is referred to as a programming voltage (Vpop).

Once programmed, the antifuse 32 has a known impedance, plus or minus a predetermined margin, which is detected by the latch circuit 34. When strobed by logic in the address detection circuit 20 (FIG. 1), the latch circuit 34 detects the impedance of the antifuse 32 and outputs an output signal that is either a logical "1" if the antifuse is programmed or a logical "0" if the antifuse is not programmed. This output signal when combined with the output signals of the remaining antifuse circuits 30 of the antifuse-bank circuit forms an address of a defective memory location (i.e., a programmed address). The operation of antifuses in an address detection circuit 20 is described, for example, in U.S. Pat. Nos. 5,734,617 (Zheng), 5,742,555 (Marr et al.), and 5,706,238 (Cutter et al), all assigned to Micron Technology Inc. and incorporated by reference herein.

In some ICs, the CGND line is directly accessible before the device is packaged (e.g., still in wafer form). During initial testing and repair, the CGND line is connected to directly using a probe card. This is referred to herein as "direct-connect" programming or a first programming mode of operation. In direct-connect programming, the probe card provides the programming voltage Vpop to the CGND line, which is used to program the appropriate antifuse. After the device is packaged, however, the direct connection to the CGND line cannot be made. Because it is desirable to make repairs to the packaged product, manufacturers will include a backdoor mechanism for applying the programming voltage Vpop to the internal CGND line from an external device. This is referred to herein as "external" programming or a second programming mode and is provided via a pin on the external package.

The backdoor mechanism typically includes a booting circuit connected between the external connection (i.e., pin/pad) and the CGND line. During normal operation of the packaged IC, the booting circuit isolates the external pin/pad from the internal CGND line. During a test mode of the packaged part, when it is desirable to program antifuses (i.e., during the second programming mode), the booting circuit receives the programming voltage Vpop from the external pin/pad and passes the voltage Vpop to the CGND line. Typically, the booting circuit uses a pass gate transistor to connect the external pad to the CGND line. The pass gate transistor is "booted" (i.e., has its gate voltage capacitively driven to an elevated level to turn it on to a preferred strength (a certain voltage from its gate to its source) and avoid any threshold voltage loss across the device) by a booting capacitor circuit.

Unfortunately, due to the self-booting nature of portions of the booting circuit, when the unpackaged memory device is being programmed by the directly connected probe (e.g., during direct-connect programming or first programming mode), the voltage on the CGND line is passed onto the external pad. This very high voltage is seen across the electrostatic discharge (ESD) device of the pad, which can breakdown and limit the programming voltage Vpop. Limiting the programming voltage Vpop increases the time required to program the antifuses and decreases the resistance distribution in blown antifuses. Both of these side effects are undesirable.

Accordingly, there is a desire and need for a booting circuit that substantially ensures that the proper voltage is applied to the antifuses during antifuse programming and in particular, during direct-connect antifuse programming.

SUMMARY OF THE INVENTION

The present invention provides a booting circuit, used during antifuse programming, which substantially ensures that the proper programming voltage is applied to the antifuses during antifuse programming.

The present invention provides a booting circuit, used during antifuse programming, which substantially ensures that the proper programming voltage is applied to the antifuses during direct-connect antifuse programming.

The above and other features and advantages are achieved by a booting circuit, used during antifuse programming, that has a clamping circuit designed to prevent a programming voltage from being unnecessarily limited by other components in a integrated circuit. The booting circuit is connected between an external interface, such as a bond pad, and an internal line, and is activated when the programming voltage is being applied directly to the internal line (i.e., not through the external interface). When activated, the clamping circuit allows a suitable and sufficiently high voltage to be applied to the internal line to properly program the antifuses, yet clamps the amount of voltage seen at the external interface. The clamping prevents ESD breakdown by the external interface from unnecessarily limiting the programming voltage.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

In addition, the embodiments of the invention are described as applied to an SDRAM (synchronous dynamic random access memory). However, the invention is not limited to SDRAMs, and it should be appreciated that the invention is equally applied to other memory devices such as, for example, static RAMs (SRAMs), dynamic RAMs (DRAMs), video RAMs (VRAMs), and erasable programmable read only memories (EPROMs). It should also be appreciated that the invention is equally applied to other devices or integrated circuits that use and program antifuses such as processors and controllers.

Figure 1:
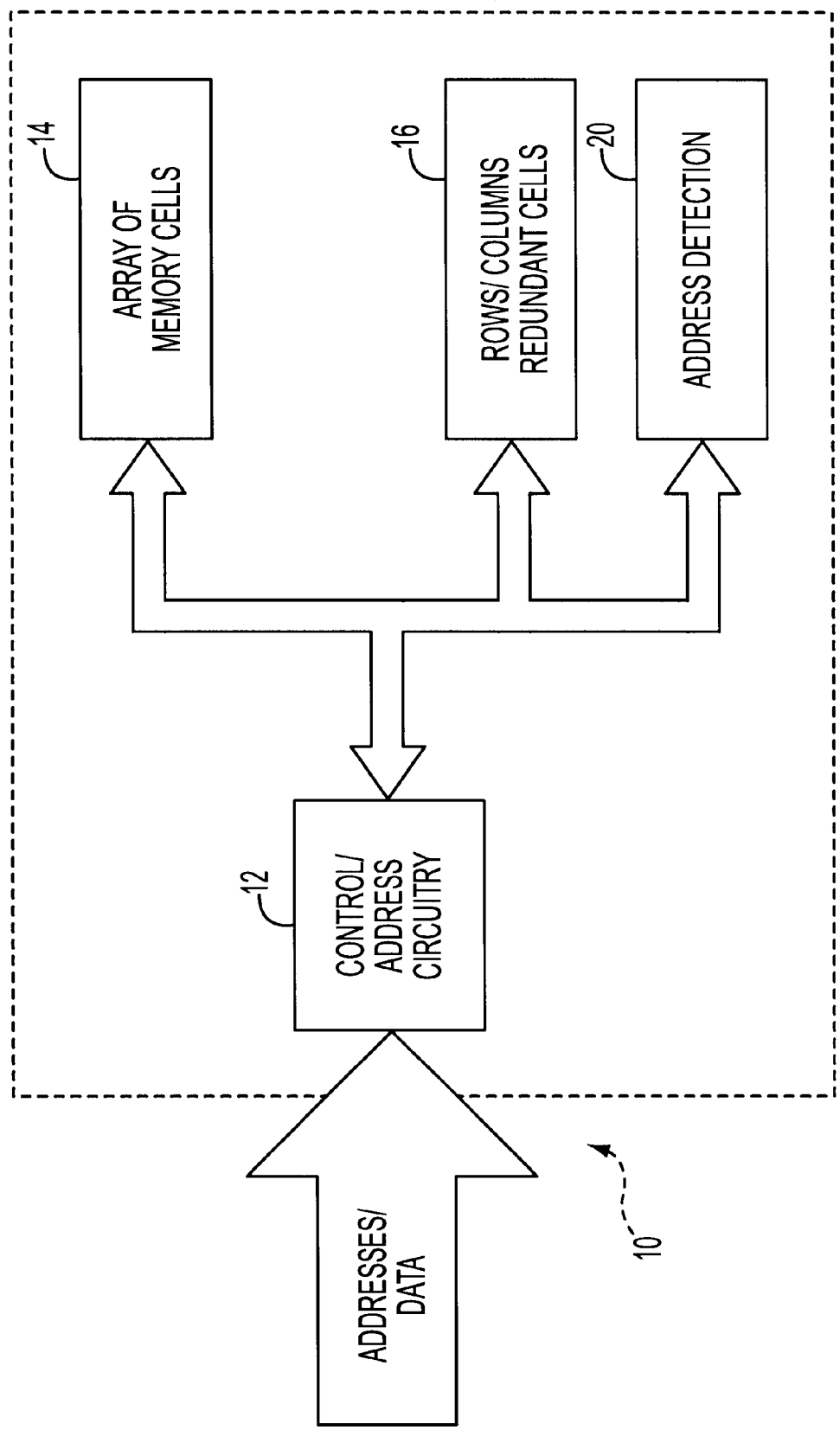
FIG. 1 is a block diagram illustrating a typical redundant memory circuit.
Figure 2:
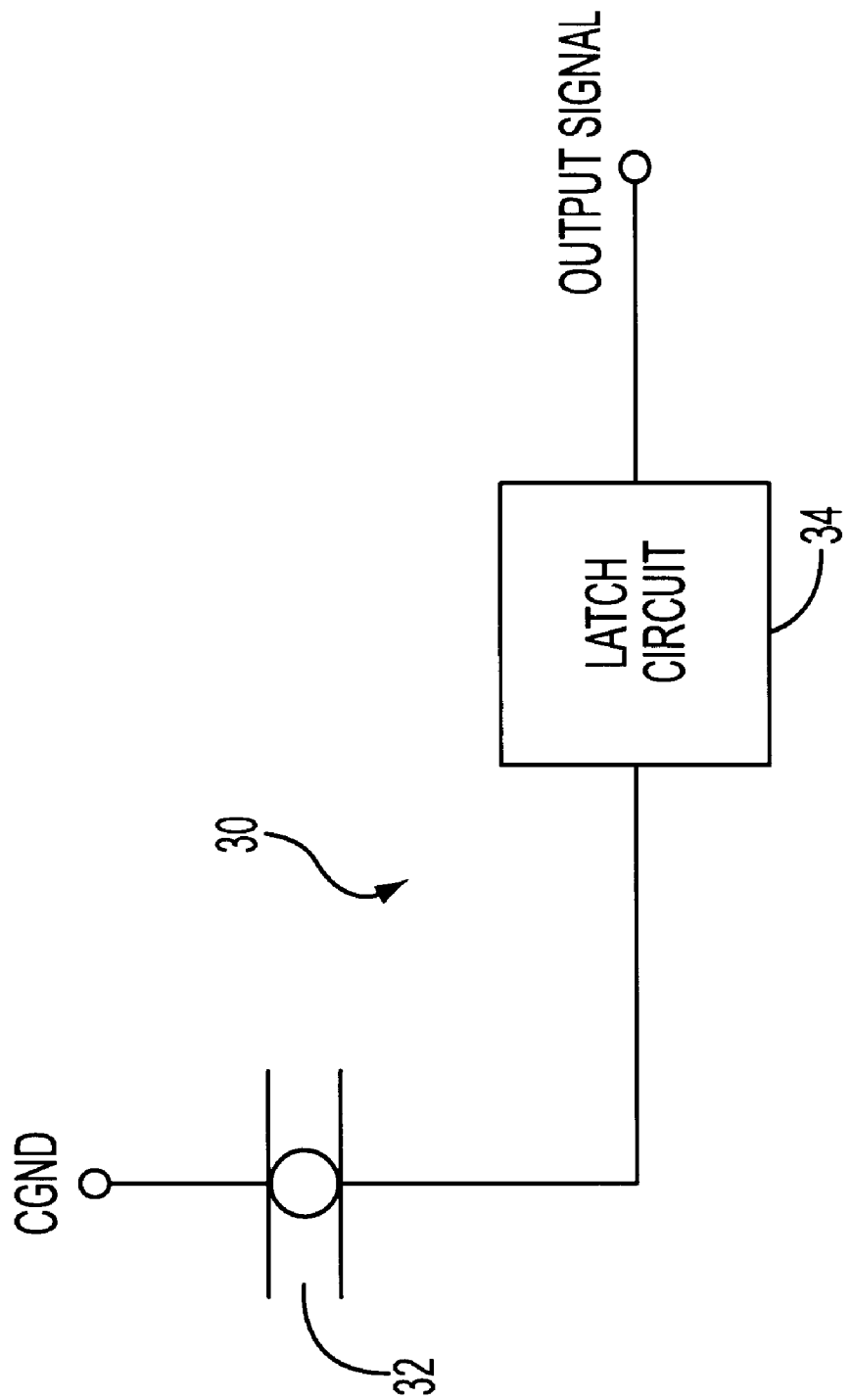
FIG. 2 illustrates an antifuse circuit used in the memory circuit illustrated in FIG. 1.
Figure 3:
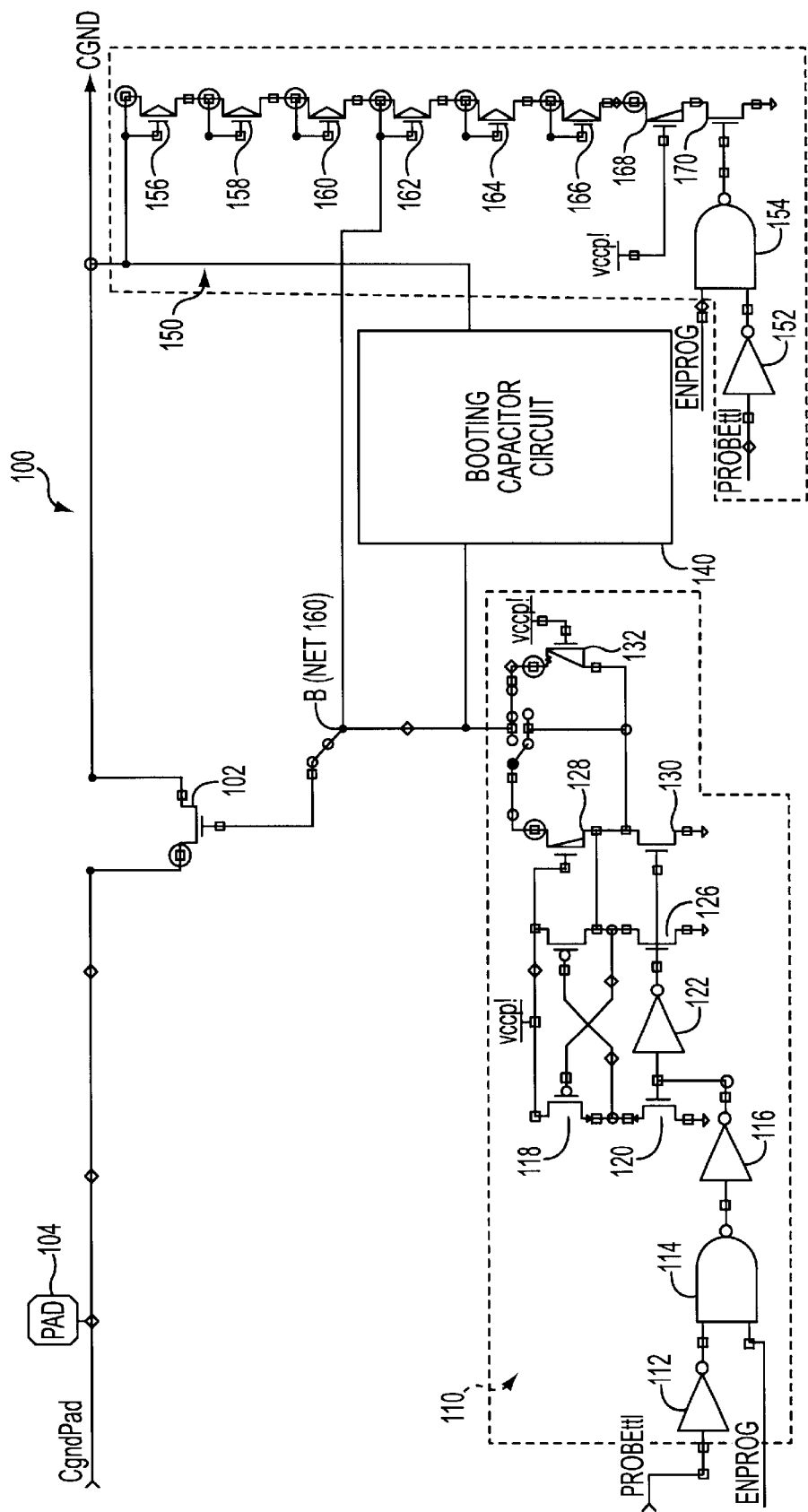
FIG. 3 illustrates a booting circuit constructed in accordance with an exemplary embodiment of the invention.

FIG. 3 illustrates a booting circuit 100 constructed in accordance with an exemplary embodiment of the invention. The circuit 100 is used in an integrated circuit such as a memory device (e.g., SDRAM) and includes a pass gate transistor 102, a precharge circuit 110, a booting capacitor circuit 140 and a clamping circuit 150. The booting circuit 100 is connected between a bond pad 104 (via line portion CgndPad) and the CGND line by the pass gate transistor 102. The bond pad 104 may be any pad suitable for receiving the programming voltage Vpop. Thus, the pad 104 serves as an interface for applying the programming voltage Vpop to the booting circuit 100 from an external source and may be referred to herein as an external interface.

The precharge circuit 110 includes three inverters 112, 116, 122, a NAND gate 114, five n-channel MOSFET (metal oxide semiconductor field effect transistor) transistors 120, 126, 128, 130, 132 and two p-channel MOSFET transistors 118, 124. The first inverter 112 has its input connected to receive a probe signal PROBEttl. The output of the first inverter 112 is connected to a first input of the NAND gate 114. The second input of the NAND gate 114 is connected to receive an enable programming signal ENPROG. The probe signal PROBEttl and the enable programming signal ENPROG are used to control the operation of the precharge circuit 110 (and the clamping circuit 150) as discussed below in more detail.

The output of the NAND gate 114 is input by the second inverter 116. The output of the second inverter 116 is input by the third inverter 122 and is also connected to the gate of the first n-channel 120. The first n-channel transistor 120 is connected between a ground potential and the first p-channel 118. The output of the third inverter 122 is connected to the gates of the second and fourth n-channel transistors 126, 130. The second n-channel transistor 126 is connected between a ground potential and the second p-channel transistor 124. The fourth n-channel transistor 130 is connected between a ground potential and the third n-channel transistor 128.

The first p-channel transistor 118 has its gate connected to the connection between the second n-channel transistor 126 and the second p-channel transistor 124. The second p-channel 124 has its gate connected to the connection between the first n-channel transistor 120 and the first p-channel transistor 118. Both of the p-channel transistors 118, 124 have their source terminals connected to a pumped voltage VCCP!. The pumped voltage VCCP! is also applied to the gate of the third n-channel transistor 128. The third n-channel transistor 128 has its source fed back to its drain and is also connected to the source of the fourth n-channel transistor 130. The fifth n-channel transistor 132 has its gate connected to the pumped voltage VCCP! and its drain connected to the connection between the third and fourth n-channel transistors 128, 130.

The fifth n-channel transistor 132 is also connected to the booting capacitor circuit 140 and a node B. As will be discussed below in more detail, the function of the precharge circuit 110 is precharge the pass gate transistor 102 to the pumped voltage VCCP!.

The booting capacitor circuit 140 is connected between the node B (NET160) and the precharge circuit 110 and is also connected to the CGND line and the clamping circuit 150. In operation, if the clamping circuit were not present, the booting capacitor circuit 140 would input the programming voltage from the CGND line, which then boots the pass gate transistor 102 (via node B). Booting the pass gate transistor 102 is not desirable, however, when direct-connect programming is being performed because the programming voltage can be passed to the pad 104. As noted above, ESD devices (or other forms of junction breakdown devices) of the pad 104 can in turn limit the programming voltage, which impacts the antifuse programming operation. Thus, the booting capacitor circuit 140 inputs the clamped programming voltage from the clamping circuit 150. As explained below, the clamped voltage does not boot the pass gate transistor 102, which prevents the aforementioned problems.

The exemplary clamping circuit 150 includes an inverter 152, a NAND gate 154, a series of six diode-connected transistors 156, 158, 160, 162, 164, 166, and two n-channel MOSFET transistors 168, 170. The input of the inverter 152 is connected to the probe signal PROBEttl. The output of the inverter 152 is connected to a first input of the NAND gate 154. The second input of the NAND gate 154 is connected to the enable programming signal ENPROG. The output of the NAND gate 154 is connected to the gate terminal of the second n-channel transistor 170. The second n-channel transistor 170 is connected between a ground potential and the first n-channel transistor 168. The first n-channel transistor is connected to the series connection of the diode-connected transistors 156, 158, 160, 162, 164, 166 and has its gate terminal connected to the pumped voltage VCCP!.

The diode-connected transistors 156, 158, 160, 162, 164, 166 are connected between the CGND line and the first n-channel transistor 168 and essentially form a voltage divider circuit for any voltage received from the CGND line. The diode-connected transistors 156, 158, 160, 162, 164, 166 are also connected to node B. The voltage division performed by the diode-connected transistors 156, 158, 160, 162, 164, 166 reduces the voltage seen at the booting capacitor circuit 140. In operation, the clamping circuit 150 is only activated when the enable programming signal ENPROG indicates that antifuse programming has been enabled and the probe signal PROBEttl indicates that programming is being performed by a directly-connected probe card. Otherwise, the clamping circuit 150 is disabled.

The booting circuit 100 operates as follows. When the enable programming signal ENPROG indicates that antifuse programming is not enabled, the precharging function of the precharge circuit 110 is disabled. Because the precharge circuit 110 is disabled, the node B is tied to a ground potential. With the node B tied to the ground potential, the pass gate transistor 102 remains off, which isolates the pad 104 from the CGND line. This situation arises when the packaged SDRAM is in normal operational mode or when testing of the unpackaged SDRAM has been completed. It should be noted that the clamping circuit 150 is also disabled at this point.

When the enable programming signal ENPROG indicates that antifuse programming is enabled, the precharging function of the precharge circuit 110 is activated, but depending upon the state of the probe signal PROBEttl, the clamping circuit 150 may or may not be activated. If the probe signal PROBEttl indicates that a directly-connected probe is not being used to supply the programming voltage, then the clamping circuit 150 is disabled. The precharge circuit 110, however, precharges the node B to the pumped voltage VCCP! and when the pad 104 is brought up to the programming voltage Vpop, the voltage at the node B and pass gate transistor 102 are self-booted (via the booting capacitor circuit 140). Once booted, the pass gate transistor 102 allows the programming voltage Vpop to pass from the pad 104 to the CGND line. It should be noted that this scenario only arises when the internal CGND line cannot be directly-connected to a probe, such as when the SDRAM has been packaged and the device is in the second programming mode.

When the enable programming signal ENPROG indicates that antifuse programming is enabled and the probe signal PROBEttl indicates that a directly-connected probe is being used to supply the programming voltage, then both the precharge circuit 110 and the clamping circuit 150 are activated. This is the first programming mode described above. Under these circumstances, the node B is precharged to the pumped voltage VCCP! by the precharge circuit 110, but when the CGND line is brought up to the programming voltage Vpop, the voltage seen at the node B is clamped by the clamping circuit 150. Because the voltage seen at the node B is clamped, the pass gate transistor 102 does not get booted and thus, does not pass the full programming voltage Vpop to the pad 104. Thus, the pad 104 does not receive the full level of the programming voltage Vpop, but the CGND line does. Because the pad 104 does not receive the full programming voltage Vpop, its ESD devices do not unnecessarily limit the voltage. As such, the full programming voltage Vpop can be applied to the antifuses (via the CGND line), which decreases the time required to program the antifuses and increases the resistance distribution in the programmed/blown antifuses—both of which are desirable and unachievable in prior art devices.

It should be noted that the clamping circuit 150 illustrated in FIG. 3 is one example of how to implement clamping in the booting circuit 100. Those skilled in the art will appreciate that the precise circuitry used in the clamping circuit 150 is not important as long as the circuitry used can clamp the programming voltage when required. It should also be appreciated that the illustrated circuitry for the precharge circuit 110 is merely one example of how to precharge the node B and that the invention is not to be limited to a particular configuration of the precharge circuit 110.

Figure 4:
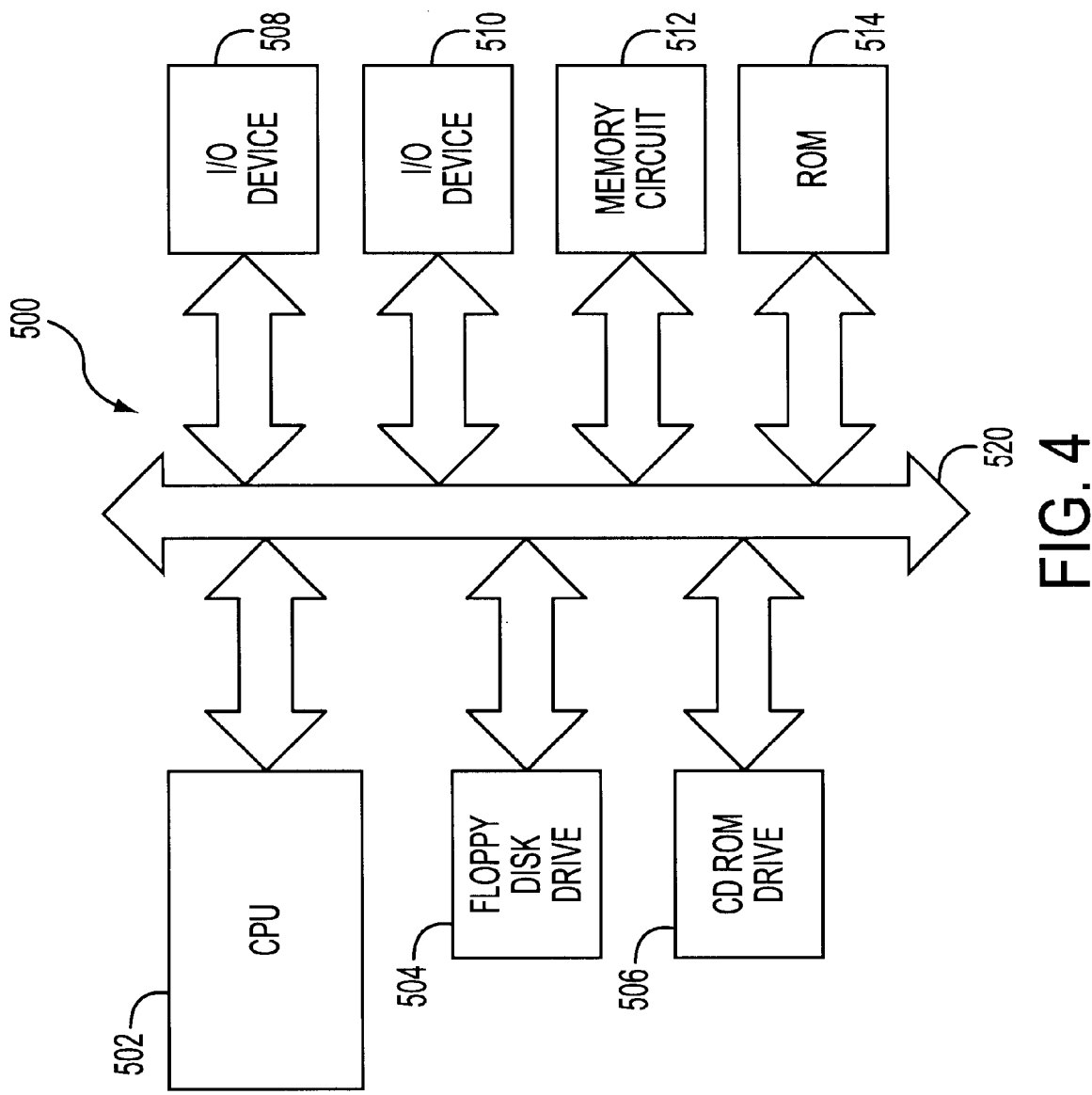
FIG. 4 illustrates a processor system incorporating a memory circuit constructed in accordance with an embodiment of the invention.

FIG. 4 illustrates a processor system 500 incorporating a memory circuit 512 constructed in accordance with an embodiment of the invention. That is, the memory circuit 512 comprises a booting circuit 100 designed to substantially ensure that the programming voltage Vpop is not unnecessarily limited during the direct-connect programming operation as explained above with respect to FIG. 3. The system 500 may be a computer system, a process control system or any other system employing a processor and associated memory.

The system 500 includes a central processing unit (CPU) 502, e.g., a microprocessor, that communicates with the DRAM memory circuit 512 and an I/O device 508 over a bus 520. It must be noted that the bus 520 may be a series of buses and bridges commonly used in a processor system, but for convenience purposes only, the bus 520 has been illustrated as a single bus. A second I/O device 510 is illustrated, but is not necessary to practice the invention. The system 500 may also include additional memory devices such as a read-only memory (ROM) device 514, and peripheral devices such as a floppy disk drive 504 and a compact disk (CD) ROM drive 506 that also communicates with the CPU 502 over the bus 520 as is well known in the art. It should be noted that the memory 512 may be embedded on the same chip as the CPU 502 if so desired.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed as new and desired to be protected by Letters Patent of the United States is:

1. A booting circuit connecting an external interface to an internal line of a device, the line being adapted to supply a programming voltage to a programmable element in the device during a programming operation, said booting circuit comprising:

a precharge circuit having a precharge output responsive to a plurality of control signals;

a clamping circuit responsive to said control signals and being adapted to receive the programming voltage from the line, said clamping circuit outputting a clamped programming voltage when activated by said control signals;

a first circuit connected to the line and said clamping circuit, said first circuit having a first output having a first voltage level based on the programming voltage or a second voltage level based on the clamped programming voltage; and a bootable element connected between the external interface and the internal line, said bootable element being controlled by said precharge output and the first output to allow the programming voltage to be directly applied to the line while preventing a full level of the programming voltage from being sent to the external interface during a first programming mode.

2. The booting circuit of claim 1, wherein said clamping circuit comprises a voltage divider circuit that-is activated when said control signals are indicative of the first programming mode.

3. The booting circuit of claim 1, wherein clamping circuit comprises:

an inverter adapted to receive a first control signal, said inverter having a second output;

a NAND gate adapted to receive a second control signal and said second output, said NAND gate having a third output;

a first switchable element connected to said third output; and a plurality of resistive elements connected between said third output and said line, wherein said resistive elements are switched into said clamping circuit when said control signals are indicative of the first programming mode.

4. The booting circuit of claim 3, wherein said resistive elements comprises diode-connected transistors.

5. The booting circuit of claim 1, wherein said bootable element is controlled by said precharge output and the first output to isolate the external interface from the line during normal operation of the device.

6. The booting circuit of claim 5, wherein said precharge output is a ground potential when said control signals are indicative of a normal operating mode of the device.

7. The booting circuit of claim 1, wherein said bootable element is controlled by said precharge output and the first output to pass an externally supplied program voltage from the external interface to the line during a second programming mode of the device.

8. The booting circuit of claim 7, wherein said precharge output is a pumped potential when said control signals are indicative of the second programming mode.

9. The booting circuit of claim 7, wherein said first output is said first level when said control signals are indicative of the second programming mode.

10. The booting circuit of claim 1, wherein said precharge output is a pumped potential when said control signals are indicative of a programming mode of the device.

11. The booting circuit of claim 1, wherein said first output is said second level when said control signals are indicative of the first programming mode.

12. The booting circuit of claim 1, wherein said bootable element is a transistor.

13. The booting circuit of claim 1, wherein said first circuit comprises a booting capacitor circuit.

14. A memory device comprising:

an external interface;

a signal line adapted to supply a programming voltage to a programmable element in said device;

a booting circuit connected between said external interface and said signal line, said booting circuit comprising:

a precharge circuit having a precharge output responsive to first and second control signals;

a clamping circuit responsive to said control signals and being adapted to receive the programming voltage from said signal line, said clamping circuit outputting a clamped programming voltage when activated by said control signals;

a first circuit connected to said signal line and said clamping circuit, said first circuit having a first output based on the programming voltage or the clamped programming voltage; and a bootable element connected between said external interface and said signal line, said bootable element being controlled by said precharge output and said first output to allow the programming voltage to be directly applied to said signal line while preventing a full level of the programming voltage from being passed to said external interface during a first programming mode.

15. The memory device of claim 14, wherein said clamping circuit comprises a voltage divider circuit that is activated when said control signals are indicative of the first programming mode.

16. The memory device of claim 14, wherein clamping circuit comprises:

an inverter adapted to receive a first control signal, said inverter having a second output;

a NAND gate adapted to receive a second control signal and said second output, said NAND gate having a third output;

a first switchable element connected to said third output; and a plurality of resistive elements connected between said third output and said signal line, wherein said resistive elements are switched into said clamping circuit when said control signals are indicative of the first programming mode.

17. The memory device of claim 16, wherein said resistive elements comprises diode-connected transistors.

18. The memory device of claim 14, wherein said bootable element is controlled by said precharge output and the first output to isolate said external interface from said signal line during normal operation of said memory device.

19. The memory device of claim 18, wherein said precharge output is a ground potential when said control signals are indicative of a normal operating mode of said memory device.

20. The memory device of claim 14, wherein said bootable element is controlled by said precharge output and the first output to pass an externally supplied program voltage from said external interface to said signal line during a second programming mode of said memory device.

21. The memory device of claim 20, wherein said precharge output is a pumped potential when said control signals are indicative of the second programming mode.

22. The memory device of claim 14, wherein said precharge output is a pumped potential when said control signals are indicative of a programming mode of said memory device.

23. The memory device of claim 14, wherein said bootable element is a transistor.

24. The memory device of claim 14, wherein said first circuit comprises a booting capacitor circuit.

25. The memory device of claim 14, wherein said external interface is a bond pad.

26. A memory device comprising:
   an external programming pin;
   an internal line that is programmable by a voltage received from said external programming pin and by a voltage received from another source; and
   a booting circuit for selectively coupling said external programming pin with said internal line to allow said internal line to be programmed by a first voltage received by said external programming pin and for uncoupling said external programming pin from said internal line to allow said internal line to be programmed with a second voltage from said another source, said booting circuit ensuring that said internal line is programmed with a full voltage level of said first and second voltages.

27. The memory device of claim 26, wherein said booting circuit comprises a clamping circuit for limiting a level of said second voltage as applied to said external programming pin.

28. The memory device of claim 27, wherein said clamping circuit is activated during a first programming mode of said memory device.

29. The memory device of claim 28, wherein said booting circuit allows said internal line to be programmed by said first voltage during a second programming mode of said memory device.

30. The memory device of claim 27, wherein said clamping circuit comprises a voltage divider circuit.

31. A processor system comprising:
   a processor; and
   a memory device coupled to said processor, said memory device comprising an external interface, a signal line adapted to supply a programming voltage to a programmable element in said device, and a booting circuit connected between said external interface and said signal line, said booting circuit comprising:
      a precharge circuit having a precharge output responsive to first and second control signals;
      a clamping circuit responsive to said control signals and being adapted to receive the programming voltage from said signal line, said clamping circuit outputting a clamped programming voltage when activated by said control signals;
      a first circuit connected to said signal line and said clamping circuit, said first circuit having a first output based on the programming voltage or the clamped programming voltage; and
      a bootable element connected between said external interface and said signal line, said bootable element being controlled by said precharge output and said first output to allow the programming voltage to be directly applied to said signal line while preventing a full level of the programming voltage from reaching said external interface during a first programming mode.

32. The system of claim 31, wherein said clamping circuit comprises a voltage divider circuit that is activated when said control signals are indicative of the first programming mode.

33. The system of claim 31, wherein clamping circuit comprises:
   an inverter adapted to receive a first control signal, said inverter having a second output;
   a NAND gate adapted to receive a second control signal and said second output, said NAND gate having a third output;
   a first switchable element connected to said third output; and
   a plurality of resistive elements connected between said third output and said signal line, wherein said resistive elements are switched into said clamping circuit when said control signals are indicative of the first programming mode.

34. The system of claim 33, wherein said resistive elements comprises diode-connected transistors.

35. The system of claim 31, wherein said bootable element is controlled by said precharge output and the first output to isolate said external interface from said signal line during normal operation of said memory device.

36. The system of claim 35, wherein said precharge output is a ground potential when said control signals are indicative of a normal operating mode of said memory device.

37. The system of claim 31, wherein said bootable element is controlled by said precharge output and the first output to pass an externally supplied program voltage from said external interface to said signal line during a second programming mode of said memory device.

38. The system of claim 37, wherein said precharge output is a pumped potential when said control signals are indicative of the second programming mode.

39. The system of claim 31, wherein said precharge output is a pumped potential when said control signals are indicative of a programming mode of said memory device.

40. The system of claim 31, wherein said bootable element is a transistor.

41. The system of claim 31, wherein said first circuit comprises a booting capacitor circuit.

42. The system of claim 31, wherein said external interface is a bond pad.

43. A processor system comprising:
   a processor; and
   a memory device coupled to said processor, said memory device comprising:
      an external programming pin, an internal line that is programmable by a voltage received from said external programming pin and by a voltage received from another source, and a booting circuit for selectively coupling said external programming pin with said internal line to allow said internal line to be programmed by a first voltage received by said external programming pin and for uncoupling said external programming pin from said internal line to allow said internal line to be programmed with a second voltage from said another source, said booting circuit ensuring that said internal line is programmed with a fill voltage level of said first and second voltages.

44. The system of claim 43, wherein said booting circuit comprises a clamping circuit for limiting a level of said second voltage as applied to said external programming pin.

45. The system of claim 44, wherein said clamping circuit is activated during a first programming mode of said memory device.

46. The system of claim 45, wherein said booting circuit allows said internal line to be programmed by said first voltage during a second programming mode of said memory device.

47. The system of claim 44, wherein said clamping circuit comprises a voltage divider circuit.

48. A method of programming a programmable element in a memory device, said method comprising the steps of:

inputting the programming voltage;

inputting control signals indicative of an operational mode of the memory device;

determining from said control signals whether the program voltage is being input from an external interface or from an internal signal line in the memory device; and if it is determined that the program voltage is being input from the internal signal line, preventing the program voltage from being sent to the external interface while allowing the program voltage to reach the programmable element.

49. The method of claim 48, further comprising the step of passing the programming voltage to the signal line if it is determined that the program voltage is being input from the external interface.

50. The method of claim 49, wherein said step of inputting the programming voltage comprises inputting the programming voltage from a bond pad of the memory device.

51. The method of claim 48, wherein said step of inputting the programming voltage comprises inputting the programming voltage from a probe being applied directly to the signal line.

* * * * *